(12) United States Patent
Kuji

(10) Patent No.: US 9,196,666 B2
(45) Date of Patent: Nov. 24, 2015

(54) ORGANIC ELECTROLUMINESCENCE DISPLAY DEVICE

(71) Applicant: Japan Display Inc., Minato-ku (JP)

(72) Inventor: Takumi Kuji, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/576,738

(22) Filed: Dec. 19, 2014

(65) Prior Publication Data

US 2015/0179725 A1 Jun. 25, 2015

(30) Foreign Application Priority Data

Dec. 20, 2013 (JP) ................................. 2013-263933

(51) Int. Cl.
*H01L 33/56* (2010.01)
*H01L 27/32* (2006.01)
*H01L 51/52* (2006.01)

(52) U.S. Cl.
CPC .......... *H01L 27/3272* (2013.01); *H01L 27/322* (2013.01); *H01L 51/5259* (2013.01)

(58) Field of Classification Search
CPC ...... H01L 33/44; H01L 33/54; H01L 51/5253
USPC ......................................... 257/100, 729, 790
See application file for complete search history.

(56) References Cited

U.S. PATENT DOCUMENTS

| 6,970,219 B1* | 11/2005 | Hermann ....................... 349/122 |
| 2003/0156080 A1* | 8/2003 | Koike et al. ..................... 345/60 |
| 2003/0209708 A1* | 11/2003 | Kubota ............................ 257/40 |
| 2006/0017383 A1* | 1/2006 | Ishida et al. ................... 313/512 |
| 2010/0096633 A1* | 4/2010 | Hatano et al. .................... 257/59 |
| 2011/0001146 A1* | 1/2011 | Yamazaki et al. ............... 257/79 |
| 2015/0001576 A1* | 1/2015 | Iwata ............................. 257/100 |

FOREIGN PATENT DOCUMENTS

JP 4696926 6/2011

\* cited by examiner

*Primary Examiner* — George Fourson, III
(74) *Attorney, Agent, or Firm* — Oblon, McClelland, Maier & Neustadt, L.L.P.

(57) ABSTRACT

An organic electroluminescence display device includes: a TFT substrate on which organic electroluminescence elements are formed; a color filter substrate having a color filter layer; a fill material with which the TFT substrate is stuck onto the color filter substrate; a dam material that dams the fill material in a non-display area; and a gas barrier film made of an inorganic material which is arranged between the fill material and the color filter layer, covers the display area in a plan view, and is formed at an interval from the dam material in the non-display area in an inside of the dam material.

6 Claims, 5 Drawing Sheets

ORGANIC ELECTROLUMINESCENCE DISPLAY DEVICE

CROSS-REFERENCE TO RELATED APPLICATION

The present application claims priority from Japanese application JP 2013-263933 filed on Dec. 20, 2013, the content of which is hereby incorporated by reference into this application.

BACKGROUND OF THE INVENTION

1. Field of the Invention

The present invention relates to an organic electroluminescence display device.

2. Description of the Prior Art

As a thin and lightweight light emission source, attention has been paid to an organic electroluminescence element. An organic electroluminescence display device having a large number of organic electroluminescence elements and a color filter has been developed.

As the organic electroluminescence display device of this type, for example, Japanese Patent No. 4696926 discloses a configuration in which an organic electroluminescence structure, a gas barrier film, and a color filter layer are laminated on each other.

SUMMARY OF THE INVENTION

In the organic electroluminescence display device having the color filter, air bubbles are generated in a display area due to gas generated from the color filter, resulting in a risk that the air bubbles reduce the visibility of a display image. On the other hand, as in the organic electroluminescence display device disclosed in Japanese Patent No. 4696926, if a gas barrier film is disposed to cover an overall color filter layer in order to suppress the generation of gas from the color filter layer, it is conceivable that the gas barrier film is deformed by the generation of gas. In this case, there is a risk that the visibility of the display image is reduced.

The present invention has been made in view of the above circumstances, and therefore an object of the present invention is to prevent a reduction in the visibility of an image displayed on an organic electroluminescence display device having a color filter.

In the invention disclosed in the present application, an outline of typical features will be described below.

(1) According to the present invention, there is provided an organic electroluminescence display device, comprising: a TFT substrate on which organic electroluminescence elements are formed in respective pixels of a display area; a color filter substrate having a color filter layer in which color filters are formed in correspondence with the respective pixels; a fill material with which a side of the TFT substrate on which the organic electroluminescence elements are formed is stuck onto a side of the color filter substrate on which the color filter layer is formed; a dam material that dams the fill material in a non-display area in an outside of the display area; and a gas barrier film made of an inorganic material which is arranged between the fill material and the color filter layer, covers the display area in a plan view, and is formed at an interval from the dam material in the non-display area in an inside of the dam material.

(2) According to the present invention, in the organic electroluminescence display device of the item (1), an overall outer periphery of the gas barrier film is located in an inside of an inner periphery of the dam material in the plan view.

(3) According to the present invention, in the organic electroluminescence display device of the item (1), an interval between the dam material and the gas barrier film is set to be equal to or larger than 0.05 mm, and equal to or smaller than 1.0 mm.

(4) According to the present invention, the organic electroluminescence display device of the item (1) may further comprising: a light shielding film made of an organic material which is arranged to surround an outside of an outer periphery of the color filter layer in a plan view, in the non-display area, wherein the light shielding film comes in contact with the dam material.

(5) According to the present invention, in the organic electroluminescence display device of the item (1), an overcoat film made of an organic material is formed between the color filter layer and the gas barrier film.

(6) According to the present invention, in the organic electroluminescence display device of the item (5), an outer periphery of the overcoat film is located in an inside of the inner periphery of the dam material in the plan view, in the non-display area, and wherein an area between the outer periphery of the overcoat film and the inner periphery of the dam material overlaps with an area between an outer periphery of the gas barrier film and the inner periphery of the dam material in the plan view.

DETAILED DESCRIPTION OF THE INVENTION

Figure 1:
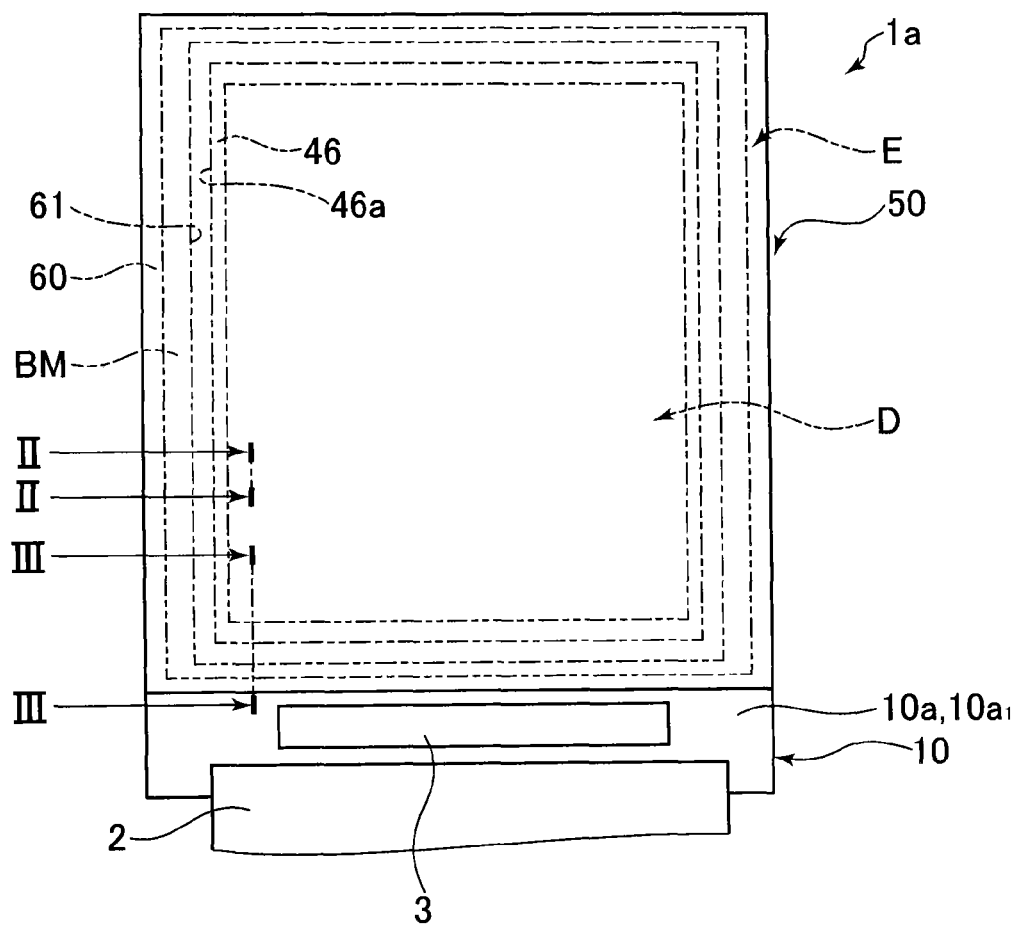
FIG. 1 is a schematic plan view of an organic electroluminescence display device according to an embodiment of the present invention.

Hereinafter, an organic electroluminescence display device according to this embodiment will be described with reference to the accompanying drawings with an organic electroluminescence display device 1*a* as an example. In the drawings to be referred in the following description, characteristic parts may be enlarged for convenience for facilitation of understanding the features, and dimensional ratios of the respective components are not always identical with the actual dimensional ratios. In addition, materials exemplified in the following description are exemplary, and the respective components may be different from those materials, and can be implemented with modifications without departing from the spirit of the present invention.

FIG. 1 is a schematic plan view of an organic electroluminescence display device 1*a* according to an embodiment of the present invention. In an upper surface 10*a* of a TFT substrate 10, an area in which an image is displayed is indicated as a display area D, and an area in which no image is displayed outside of the display area D is indicated as a non-display area E.

As illustrated in FIG. 1, a color filter substrate 50 is arranged in the display area D in the upper surface 10a of the TFT substrate 10. Also, in the non-display area E, a flexible circuit board 2 is connected to an area $10_{a1}$ in which the color filter substrate 50 is not arranged, and a drive IC (integrated circuit) 3 is further disposed on the area $10_{a1}$.

The drive IC 3 is an IC arranged on the TFT substrate 10, to which image data is supplied from an external of the organic electroluminescence display device 1a through the flexible circuit board 2. The drive IC 3 receives the image data, and supplies a voltage signal to be applied to respective pixels to organic electroluminescence elements 30 which will be described later through data lines not shown.

Figure 2:
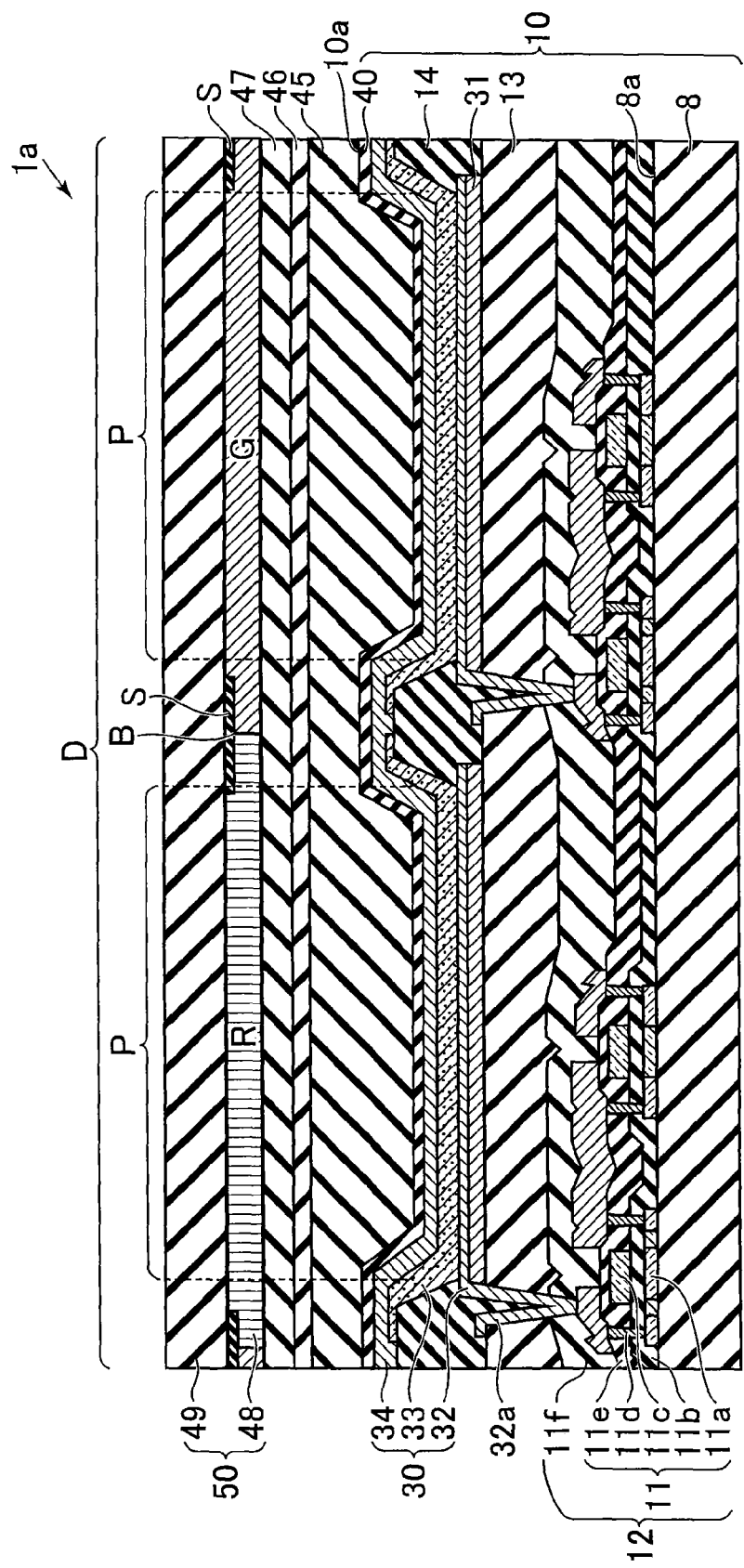
FIG. 2 is a schematic cross-sectional view taken along a line II-II of the organic electroluminescence display device illustrated in FIG. 1.

Subsequently, a configuration of the display area D of the organic electroluminescence display device 1a will be described in detail. FIG. 2 is a schematic cross-sectional view taken along a line II-II of the organic electroluminescence display device 1a illustrated in FIG. 1. As illustrated in FIG. 2, a fill material 45, a gas barrier film 46, an overcoat film 47, and the color filter substrate 50 are laminated on the TFT substrate 10 in the display area D. Also, plural pixels P are arranged on the TFT substrate 10 in a matrix.

The TFT substrate 10 includes an insulating substrate 8, a circuit layer 12, a planarizing film 13, the organic electroluminescence elements 30 formed in the respective pixels P in the display area D, and a sealing film 40.

The insulating substrate 8 is formed of an insulating substrate, and the circuit layer 12 and the organic electroluminescence elements 30 are formed on an upper surface 8a of the insulating substrate 8.

The circuit layer 12 is a layer on which thin film transistors 11, a passivation film 11f, and electric lines not shown are formed. The circuit layer 12 is formed to drive the organic electroluminescence elements 30.

The thin film transistors 11 are disposed on the insulating substrate 8 for the respective pixels P. The thin film transistors 11 each include, for example, a polysilicon semiconductor layer 11a, a gate insulating layer 11b, a gate electrode 11c, a source/drain electrode 11d, and a first insulating film 11e. Also, the thin film transistors 11 are covered with the passivation film 11f that is an insulating film for protecting the thin film transistors 11.

The planarizing film 13 is formed to cover the circuit layer 12. The planarizing film 13 is a layer made of an insulating material. The planarizing film 13 is formed between the insulating substrate 8 and the organic electroluminescence elements 30 so that electric isolation is performed between the respective adjacent thin film transistors 11, and between the thin film transistors 11 and the organic electroluminescence elements 30. The planarizing film 13 is made of a material having an insulating property such as $SiO_2$, SiN, acrylic, or polyimide.

Reflective films 31 may be formed in areas corresponding to the respective pixels P on the planarizing film 13. The reflective films 31 are disposed to reflect a light emitted from the organic electroluminescence elements 30 toward the color filter substrate 50 side. It is preferable that a material of the reflective films 31 is higher in optical reflectance, and the reflective films 31 are each made of a metal film made of, for example, aluminum or silver (Ag).

The plural organic electroluminescence elements 30 are formed in the respective pixels P on the planarizing film 13. Each of the organic electroluminescence elements 30 includes a lower electrode 32, an organic layer 33 having at least a light emitting layer, and an upper electrode 34 formed to cover the organic layer 33 whereby an area in which the lower electrode 32, the organic layer 33, and the upper electrode 34 overlap with each other functions as a light emitting area.

The lower electrode 32 is an electrode that supplies a drive current into the organic layer 33. The lower electrode 32 is connected to each contact hole 32a so as to be electrically connected to each of the thin film transistors 11, and supplied with the drive current.

The lower electrode 32 is made of a material having conductivity. It is preferable that the lower electrode 32 is made of, specifically, for example, ITO (indium tin oxide). Alternatively, the lower electrode 32 may be made of a material having translucency and conductivity such as IZO (indium zinc complex oxide), tin oxide, zinc oxide, indium oxide, or aluminum oxide mixed oxide. If the reflective film is made of silver or the like, and comes in contact with the lower electrode 32, the lower electrode 32 may have translucency. In this configuration, the reflective film forms a part of the lower electrode 32.

A pixel separation film 14 is formed between the respective adjacent lower electrodes 32, for example, along a boundary B between the respective adjacent pixels P. The pixel separation film 14 has a function of preventing a contact between the respective adjacent lower electrodes 32, and a leakage current between the lower electrode 32 and the upper electrode 34. The pixel separation film 14 is made of an insulating material, and specifically, for example, a translucent resin composition.

The organic layer 33 is a layer made of an organic material having at least a light emitting layer. The organic layer 33 is formed to cover the plural lower electrodes 32 and the pixel separation film 14. The organic layer 33 may be formed to cover an overall area of the display area D in which the pixels P are arranged. The organic layer 33 has a layer that emits, for example, a light of white.

The organic layer 33 is formed so that a hole injection layer, a hole transport layer, a light emitting layer, an electron transport layer, and an electron injection layer, which are not shown, are laminated on each other in stated order from the lower electrode 32 side. A laminated structure of the organic layer 33 is not limited to this example, but the laminated structure is not specified if at least the light emitting layer is included in the laminated structure.

The light emitting layer is made of, for example, an organic electroluminescence material that emits light by coupling holes with electrons. The organic electroluminescence material of this type may generally employ an organic light emitting material.

The upper electrode 34 is formed to cover the organic layer 33. The upper electrode 34 is not independent for each of the pixels P, and formed to cover the overall area of the display area D in which the pixels P are arranged. With the provision of this configuration, the upper electrode 34 comes in common contact with the organic layers 33 of the plural organic electroluminescence elements 30.

The upper electrode 34 is made of a material having the translucency and the conductivity. It is preferable that the upper electrode 34 is made of, specifically, for example, ITO. Alternatively, the upper electrode 34 may be made of a mixture of a conductive metal oxide such as ITO or InZnO with metal such as silver or magnesium, or a lamination of a metal thin film made of silver or magnesium and a conductive metal oxide.

An upper surface of the upper electrode 34 is covered with the sealing film 40 over the plural pixels P. The sealing film 40 is formed to prevent oxygen or moisture from being penetrated into the respective layers including the organic layer 33. The material of the sealing film 40 is not particularly limited if a transparent material having an insulating property is used.

The color filter substrate 50 is arranged over an upper surface (upper surface 10a of the TFT substrate 10) of the sealing film 40 through the fill material 45. The gas barrier film 46 and the overcoat film 47 are arranged between the color filter substrate 50 and the fill material 45.

The fill material 45 is a transparent material filled between the TFT substrate 10 and the color filter substrate 50 in the display area D. The upper surface 10a of the TFT substrate 10 on which the organic electroluminescence elements 30 are formed, and the side of the color filter substrate 50 on which a color filter layer 48 is formed are stuck onto each other with the filling of the fill material 45. The fill material 45 includes a transparent organic material such as epoxy resin.

The color filter substrate 50 is a substrate having an outer periphery smaller than that of the TFT substrate 10 in a plan view. The color filter substrate 50 includes the color filter layer 48, and, for example, a glass substrate 49. The color filter layer 48 is a layer in which color filters are formed in correspondence with the respective pixels P. The color filters are each formed by, for example, optically curing a resist in which pigment is dispersed. The color filter layer 48 is partitioned into, for example, an area R, an area B, and an area G in correspondence with the respective pixels P by partition films S having a light shielding property.

The gas barrier film 46 made of an inorganic material is arranged between the color filter layer 48 of the color filter substrate 50 and the fill material 45. Also, the overcoat film 47 made of an organic material may be formed between the color filter layer 48 and the gas barrier film 46 as illustrated in FIG. 2.

The overcoat film 47 is a film formed to planarize a surface on the fill material 45 side of the color filter layer 48. The overcoat film 47 is made of a material obtained by optically curing a transparent resist made of, for example, an organic material.

The gas barrier film 46 is a film arranged to prevent gas generated from the color filter layer 48 or the overcoat film 47 from being generated as air bubbles on the fill material 45 side. For that reason, as illustrated in FIG. 1, the gas barrier film 46 is arranged to cover the display area D in the plan view. The gas barrier film 46 is made of an inorganic material such as $SiO_2$ or SiN.

Figure 3:
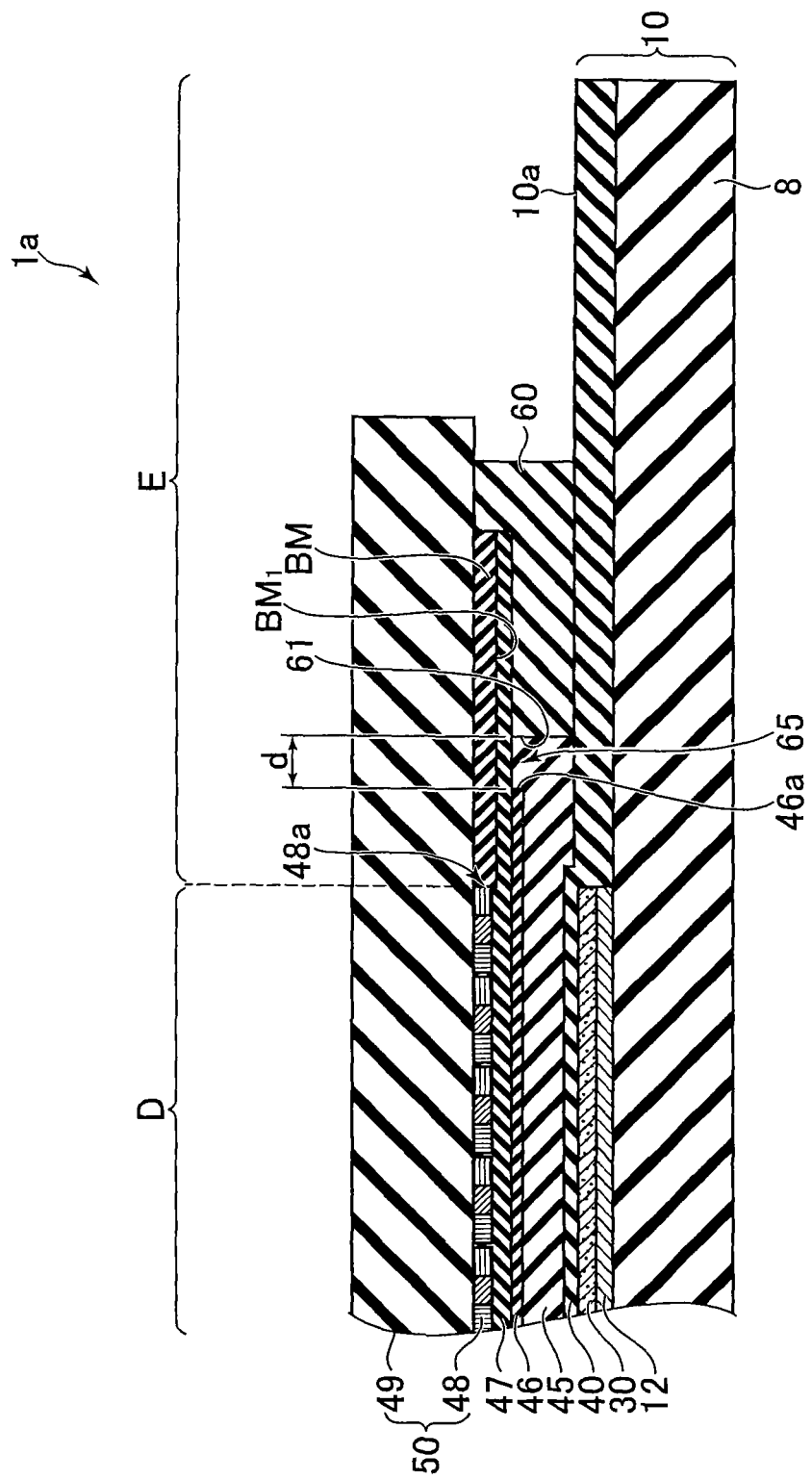
FIG. 3 is a schematic cross-sectional view taken along a line of the organic electroluminescence display device illustrated in FIG. 1.

Subsequently, a configuration of the organic electroluminescence display device 1a in the non-display area E will be described in detail. FIG. 3 is a schematic cross-sectional view taken along a line of the organic electroluminescence display device illustrated in FIG. 1. In FIG. 3, for convenience of description, a detailed configuration of the organic electroluminescence elements 30 will be omitted.

In the non-display area E, as illustrated in FIGS. 1 and 3, a light shielding film BM is arranged. The light shielding film BM is a film having a light shielding property which is provided to prevent the light emission from the display area D from being displayed in the non-display area E. The light shielding film BM is made of, for example, an organic material such as a resist in which carbon is dispersed. The light shielding film BM is formed to surround the outside of an outer periphery 48a of the color filter layer 48 in a plan view. Also, the light shielding film BM may be formed so that a part of the light shielding film BM overlaps with the color filter layer 48 as the partition film S.

In an example illustrated in FIG. 3, a surface (lower surface $BM_1$) on the fill material 45 side of the light shielding film BM is completely covered with the overcoat film 47. However, if at least color filter layer 48 is covered with the overcoat film 47, the lower surface $BM_1$ may not be covered with the overcoat film 47.

Also, as illustrated in FIGS. 1 and 3, in the non-display area E, a dam material 60 that dams the fill material 45 is disposed. The dam material 60 is sealed between the TFT substrate 10 and the color filter substrate 50 in the non-display area E along the outer periphery of the display area D to dam the fill material 45. The dam material 60 is made of an organic material. The dam material 60 is formed by optically curing or thermally curing the epoxy resin in which spacers such as plastic beads are dispersed.

In an example illustrated in FIG. 3, the lower surface $BM_1$ of the light shielding film BM comes in contact with the dam material 60 through the overcoat film 47. Alternatively, the lower surface $BM_1$ of the light shielding film BM may come in direct contact with the dam material 60.

As illustrated in FIGS. 1 and 3, an outer periphery 46a of the gas barrier film 46 in the non-display area E is formed at an interval from an inner periphery 61 of the dam material 60 inside of the dam material 60. It is preferable that the outer periphery 46a of the gas barrier film 46 is completely located inside of the inner periphery 61 of the dam material 60 in the plan view. Also, at least a part of the outer periphery 46a of the gas barrier film 46 may be located inside of the inner periphery 61.

As illustrated in FIG. 3, when it is assumed that a width of an interval 65 between the inner periphery 61 of the dam material 60 and the outer periphery 46a of the gas barrier film 46 is a width d, it is preferable that the width d is equal to or larger than 0.05 mm, and equal to or smaller than 1.0 mm.

Figure 4:
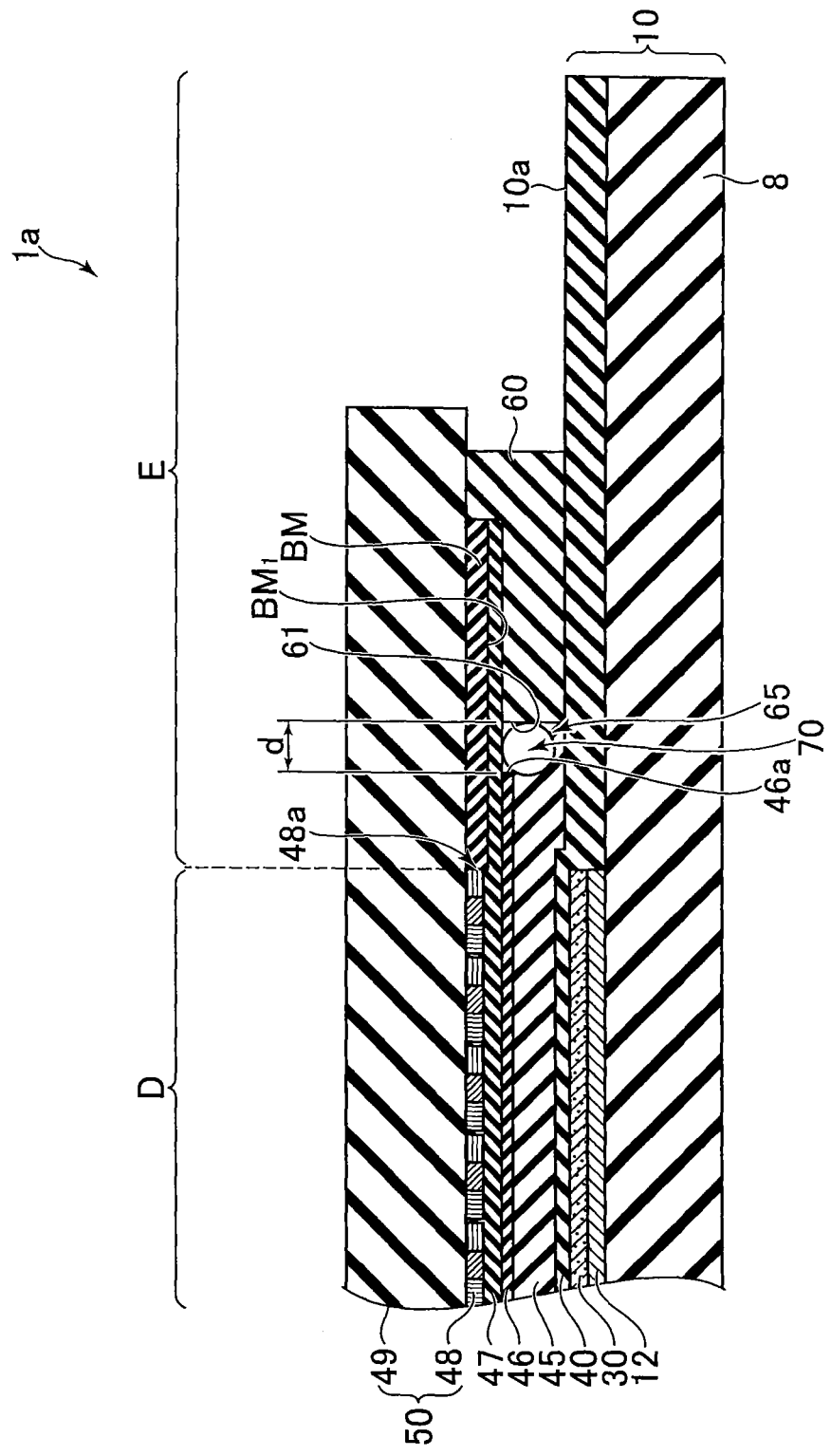
FIG. 4 is a schematic cross-sectional view illustrating a state in which air bubbles are generated in the organic electroluminescence display device illustrated in FIG. 2.

FIG. 4 is a schematic cross-sectional view illustrating a state in which air bubbles 70 are generated in the organic electroluminescence display device 1a illustrated in FIG. 2. In the organic electroluminescence display device 1a according to this embodiment, the outer periphery 46a of the gas barrier film 46 in the non-display area E is formed at an interval from the inner periphery 61 of the dam material 60 inside of the dam material 60. With the above configuration, even if gas generated from the color filter layer 48 or the overcoat film 47 form the air bubbles 70, the air bubbles 70 can be collected in the interval 65. Also, because the interval 65 is located in the non-display area E, even if the air bubbles 70 are generated in the interval 65, a reduction in the visibility of an image displayed on the organic electroluminescence display device 1a can be prevented. This is because the air bubbles 70 generated from the color filter layer 48 or the overcoat film 47 which are made of an organic material are blocked by the gas barrier film 46 made of an inorganic material difficult through the gas in the display area D. With this configuration, the air bubbles 70 thus generated are transmitted along an interface between the gas barrier film 46 and the overcoat film 47, and migrate to the interval 65. For that reason, the air bubbles are prevented from being generated on the fill material 45 side.

Also, in the organic electroluminescence display device 1a according to this embodiment, the gas barrier film 46 made of the inorganic material comes out of contact with the dam material 60 made of the organic material. For that reason, the generated air bubbles 70 pass along the interface between the gas barrier film 46 and the overcoat film 47, and are captured by the interval 65 before reaching an area in which the dam material 60 is arranged. Hence, as compared with the organic electroluminescence display device in which the gas barrier film comes in contact with the dam material, the air bubbles 70 hardly come in contact with the dam material 60, and a failure caused by peeling off the dam material 60 is suppressed.

Also, in the organic electroluminescence display device 1a according to this embodiment, the outer periphery 46a of the gas barrier film 46 is completely located inside of the inner periphery 61 of the dam material 60 in the plan view. As a result, as compared with the organic electroluminescence display device without providing this configuration, the gas generated from the color filter layer 48 or the overcoat film 47 is likely to be collected into the interval 65. For that reason, the air bubbles 70 are prevented from being generated in the display area D, and the reduction in the visibility of an image to be displayed on the organic electroluminescence display device 1a can be suppressed.

Also, in the organic electroluminescence display device 1a according to this embodiment, the width d of the interval 65 is set to be equal to or larger than 0.05 mm, and equal to or smaller than 1.0 mm, whereby the air bubbles 70 can be collected in the interval 65 without narrowing the display area D. For that reason, the reduction in the visibility of the image to be displayed on the organic electroluminescence display device 1a can be suppressed.

Also, in the organic electroluminescence display device 1a according to this embodiment, the light shielding film BM made of the organic material comes in direct contact with the dam material 60 made of the organic material with the results that as compared with the configuration in which the light shielding film comes in contact with the dam material through the gas barrier film made of the inorganic material, the peeling of the dam material 60 is suppressed. For that reason, the failure caused by the peeling of the dam material 60, and the reduction in the visibility can be prevented.

Figure 5:
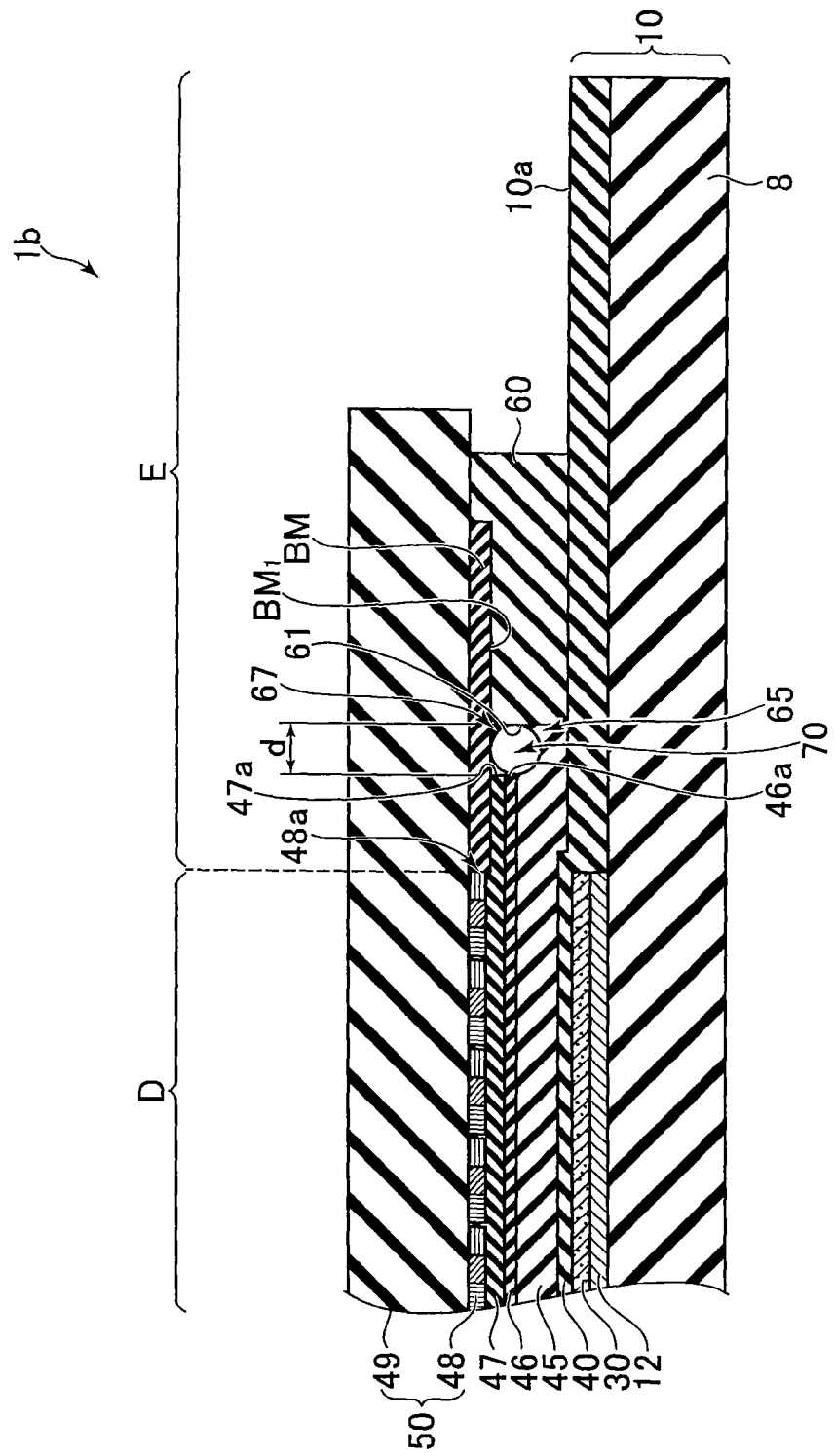
FIG. 5 is a partially enlarged view illustrating a state in which air bubbles are generated in a modification of the organic electroluminescence display device in the same viewing field as that in FIG. 2 according to this embodiment.

Subsequently, a configuration of an organic electroluminescence display device 1b, which is a modification of the organic electroluminescence display device 1a, according to this embodiment will be described. FIG. 5 is a partially enlarged view illustrating a state in which air bubbles are generated in a modification 1b of the organic electroluminescence display device 1a in the same viewing field as that in FIG. 2 according to this embodiment.

Unlike the organic electroluminescence display device 1a, in the organic electroluminescence display device 1b, an outer periphery 47a of the overcoat film 47 is located inside of the inner periphery 61 of the dam material 60 in the non-display area E in the plan view. Also, in the organic electroluminescence display device 1b, the area (interval) 65 between the outer periphery 47a of the overcoat film 47 and the inner periphery 61 of the dam material 60 overlaps with an area 67 between the outer periphery 46a of the gas barrier film 46 and the inner periphery 61 of the dam material 60 in the plan view.

In the organic electroluminescence display device 1b according to this embodiment, the area 67 between the gas barrier film 46 and the dam material 60 overlaps with the area 65 in which the overcoat film 47 is not arranged, in the non-display area E. For that reason, as compared with the organic electroluminescence display device without providing this configuration, a step between the lower surface 46b of the gas barrier film 46 and the lower surface $BM_1$ of the light shielding film BM in the area where the area 65 overlaps with the area 67 becomes large.

For that reason, as compared with the organic electroluminescence display device without providing this configuration, in the organic electroluminescence display device 1b according to this embodiment, the air bubbles 70 generated from the color filter layer 48 or the overcoat film 47 are likely to be collected in the area where the area 65 overlaps with the area 67. With this configuration, the reduction in the visibility of the image to be displayed on the organic electroluminescence display device 1b can be prevented. The area (interval) 65 between the outer periphery 47a of the overcoat film 47 and the inner periphery 61 of the dam material 60 does not need to overlap with the area 67 between the outer periphery 46a of the gas barrier film 46 and the inner periphery 61 of the dam material 60 in a completely identical area in the plan view, but the area 65 and the area 67 may at least partially overlap with each other in the plan view. If the area 65 and the area 67 overlap with each other even partially in the plan view, the air bubbles 70 generated from the color filter layer 48 or the overcoat film 47 are likely to be collected in the area where the area 65 and the area 67 overlap with each other.

The embodiments of the present invention have been described above, but the present invention is not limited to the above embodiment. For example, the configuration described in the above embodiments can be replaced with substantially the same configuration, the configuration to achieve the same effects, or the configuration that can achieve the same purpose.

For example, the organic electroluminescence display device according to this embodiment has only to provide the color filter layer 48, and the light emission of the organic electroluminescence elements 30 is not limited to white, but may be other colors. Also, plural kinds of emission colors of the organic electroluminescence elements 30 may be provided. Also, the present invention is not limited to the organic electroluminescence display device, but may be applied to a liquid crystal display device.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic electroluminescence display device, comprising:
   a TFT substrate on which organic electroluminescence elements are formed in respective pixels of a display area;
   a color filter substrate having a color filter layer in which color filters are formed in correspondence with the respective pixels;
   a fill material with which a side of the TFT substrate on which the organic electroluminescence elements are formed is stuck onto a side of the color filter substrate on which the color filter layer is formed;
   a dam material that dams the fill material in a non-display area in an outside of the display area; and
   a gas barrier film made of an inorganic material which is arranged between the fill material and the color filter layer, covers the display area in a plan view, and is formed at an interval from the dam material in the non-display area in an inside of the dam material.

2. The organic electroluminescence display device according to claim 1,
   wherein an overall outer periphery of the gas barrier film is located in an inside of an inner periphery of the dam material in the plan view.

3. The organic electroluminescence display device according to claim 1,
   wherein an interval between the dam material and the gas barrier film is set to be equal to or larger than 0.05 mm, and equal to or smaller than 1.0 mm.

4. The organic electroluminescence display device according to claim 1, further comprising: a light shielding film made of an organic material which is arranged to surround an outside of an outer periphery of the color filter layer in a plan view, in the non-display area,
  wherein the light shielding film comes in contact with the dam material.

5. The organic electroluminescence display device according to claim 1,
  wherein an overcoat film made of an organic material is formed between the color filter layer and the gas barrier film.

6. The organic electroluminescence display device according to claim 5,
  wherein an outer periphery of the overcoat film is located in an inside of the inner periphery of the dam material in the plan view, in the non-display area, and
  wherein an area between the outer periphery of the overcoat film and the inner periphery of the dam material overlaps with an area between an outer periphery of the gas barrier film and the inner periphery of the dam material in the plan view.

\* \* \* \* \*